(12) United States Patent
Duan et al.

(10) Patent No.: US 12,293,786 B2
(45) Date of Patent: May 6, 2025

(54) METHOD FOR READING MEMORY, A MEMORY, A MEMORY SYSTEM, AND ELECTRONIC DEVICE

(71) Applicant: YANGTZE MEMORY TECHNOLOGIES CO., LTD., Wuhan (CN)

(72) Inventors: Zhuqin Duan, Wuhan (CN); Xiaojiang Guo, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 240 days.

(21) Appl. No.: 18/089,512

(22) Filed: Dec. 27, 2022

(65) Prior Publication Data
US 2024/0194248 A1    Jun. 13, 2024

(30) Foreign Application Priority Data
Dec. 9, 2022    (CN) .......................... 202211585949.3

(51) Int. Cl.
G11C 11/408    (2006.01)
G11C 11/4096    (2006.01)

(52) U.S. Cl.
CPC ...... *G11C 11/4096* (2013.01); *G11C 11/4085* (2013.01)

(58) Field of Classification Search
CPC ............ G11C 11/4096; G11C 11/4085; G11C 7/1015
See application file for complete search history.

(56) References Cited

U.S. PATENT DOCUMENTS

2022/0342823 A1 *  10/2022  D'Eliseo ............. G06F 12/0215

* cited by examiner

*Primary Examiner* — Jay W. Radke
(74) *Attorney, Agent, or Firm* — BAYES PLLC

(57) ABSTRACT

A method includes applying a first read voltage to a word line corresponding to a first word line address in a first read request instruction. The method also includes detecting an obtained second read request instruction. The method further includes when the second word line address included in the second read request instruction is the same as the first word line address, applying a second read voltage to the word line corresponding to the first word line address after the end of the application of the first read voltage.

20 Claims, 4 Drawing Sheets

METHOD FOR READING MEMORY, A MEMORY, A MEMORY SYSTEM, AND ELECTRONIC DEVICE

CROSS-REFERENCE TO RELATED APPLICATIONS

This application claims the benefit of priority to Chinese Application No. 202211585949.3, filed on Dec. 9, 2022, which is incorporated herein by reference in its entirety.

TECHNICAL FIELD

The present disclosure relates to the technical field of storage, and in particular to a method for reading memory, a memory, a memory system, and an electronic device.

BACKGROUND

Cache read is a kind of pipelined read that allows one page to be read from the page cache while another page is read from the memory array. The memory may obtain the next cache read address before the current read is finished. However, generally in the cache read operation, the read of each of the pages is completely independent, which makes the read time longer and increases the power consumption during the read.

SUMMARY

The present disclosure provides a method for reading memory, a memory, a memory system, and an electronic device, intended to solve the problems of long read time and increased power consumption when performing cache read for a memory. For the above purpose, the present disclosure employs the following technical solutions:

In an aspect, a method for cache reading of a memory is provided. The method comprises, after obtaining a first read request instruction, firstly, applying a first read voltage to a word line corresponding to a first word line address in the first read request instruction; then detecting an obtained second read request instruction; and while the second word line address included in the second read request instruction is the same as the first word line address, applying a second read voltage to the word line corresponding to the first word line address after the end of the application of the first read voltage. The memory described above may be a two-dimensional memory or a three-dimensional memory. When the second word line address is the same as the first word line address, the second read voltage may be sequentially applied to the first word line address directly after the end of the application of the first read voltage, without restoring the first read voltage to a low level and then applying the pre-pulse voltage before applying the second read voltage. Therefore, the read time and power consumption with the same word line are reduced.

In some implementations, the first read request instruction further includes a first string address; the second read request instruction further includes a second string address. Before applying a second read voltage to the word line corresponding to the first word line address, the method further includes: determining that the second string address is the same as the first string address. Based on this, when the second word line address is the same as the first word line address, and the second string address is the same as the first string address, the second read voltage may be directly applied to the first word line, therefore, the read time and power consumption with the same word line address and the same string address are reduced.

In some implementations, the first read request instruction further includes a first string address; the second read request instruction further includes a second string address; before applying the second read voltage to the word line corresponding to the first word line address, the method described above also includes: when the second string address is different from the first string address of the controller, the top selective gate corresponding to the first string address is turned off and the top selective gate corresponding to the second string address is turned on. Based on this, when the word line addresses are the same and the string addresses are different in the two read request instructions, the top selective gate corresponding to the second string address may be switched on in time, then the second read voltage may be directly applied to the first word line address, thereby reducing the read time and power consumption when the word line addresses are the same, but the string addresses are different.

In some implementations, the first string address and the second string address are continuous addresses or random addresses. When reading a memory, it may be performed in the manner of cache read in order or out of order; when the word line addresses corresponding to the previous and subsequent read request instructions are the same, the string addresses read in the manner of cache read in order are continuous; and the string addresses read in the manner of cache read out of order are random, i.e., may be continuous or random. In the reading method provided by the present disclosure, when the second word line address is the same as the first word line address, regardless of the string addresses corresponding to the previous and subsequent read request instructions are continuous or random, after the end of the application of the first read voltage, the second read voltage may be sequentially applied to the word line corresponding to the first word line address, thereby reducing the read time and power consumption of the same word line.

In some implementations, when the second word line address in the second read request instruction is different from the first word line address, the voltage applied to the word line corresponding to the first word line address may be restored to a low level after the end of the application of the first read voltage; then a pre-pulse voltage may be applied to the word line corresponding to the second word line address; and finally, after the end of the application of the pre-pulse voltage, the second read voltage may be applied to the word line corresponding to the second word line address, therefore, when the word line addresses corresponding to the previous and subsequent read request instructions are different, the impact of the hot carrier injection phenomenon is reduced by applying the pre-pulse voltage, and the service life of the memory is prolonged.

In some implementations, if a second read request instruction is not detected, the voltage applied to the word line corresponding to the first word line address is restored to a low level after the end of the application of the first read voltage. Based on this, whether a new read request instruction may be first detected during the application of the first read voltage, if no new read request instruction is detected, the voltage applied to the word line corresponding to the first word line address is restored to a low level after the end of the application of the first read voltage, and the read process ends; compared with the existing method of restoring the first read voltage to a low level and then detecting whether a new read request instruction, the above method can further reduce the read time.

In some implementations, before applying the first read voltage to the word line corresponding to the first word line address, the method described above further includes: applying a pre-pulse voltage to the word line corresponding to the first word line address. Based on this, when the word line corresponding to the first word line address is read for the first time, the impact of the hot carrier injection phenomenon may be reduced by applying the pre-pulse voltage, and the service life of the memory is prolonged.

In some implementations, the first read request instruction is for reading the first page; the second read request instruction is for reading the second page; the at least one first read voltage includes a plurality of voltages for reading the first page; the at least one second read voltage includes a plurality of voltages for reading the second page. Based on this, when the pages corresponding to the previous and subsequent read request instructions are adjacent, the read voltage of the second page may be sequentially applied after the end of the application of the read voltage of the first page to reduce the process of restoring the read voltage to a low level and pre-charging, thereby reducing the time and power consumption of reading.

In some implementations, after the end of the application of the first read voltage and before applying a second read voltage to the word line corresponding to the first word line address, there is no need to restore the voltage applied to the word line corresponding to the first word line address to a low level before applying the pre-pulse voltage.

In another aspect, a memory is provided. The memory includes a memory array and a peripheral circuit. The memory array includes a plurality of word lines and a plurality of bit lines; the peripheral circuit is coupled to the plurality of word lines and the plurality of bit lines. The peripheral circuit is configured to apply a first read voltage to a word line corresponding to a first word line address in a first read request instruction; detect an obtained second read request instruction; and when the second word line address included in the second read request instruction is the same as the first word line address, apply a second read voltage to the word line corresponding to the first word line address after the end of the application of the first read voltage.

In some implementations, the peripheral circuit includes control logic and a voltage generator. The control logic circuit is configured to receive the first read request instruction and control the voltage generator to apply a first read voltage to a word line corresponding to a first word line address in a first read request instruction; and detect a second read request instruction; when the second word line address included in the second read request instruction is the same [with] as the first word line address, control the voltage generator to apply a second read voltage to the word line corresponding to the first word line address after the end of the application of the first read voltage.

In some implementations, the first read request instruction further includes a first string address; the second read request instruction further includes a second string address. After the end of the application of the first read voltage, and before the voltage generator is controlled to apply the second read voltage to the word line corresponding to the first word line address, the control logic circuit is further configured to determine that the second string address is the same as the first string address.

In some implementations, the first read request instruction further includes a first string address; the second read request instruction further includes a second string address. Before the voltage generator is controlled to apply the second read voltage to the word line corresponding to the first word line address, the control logic circuit is further configured to control the voltage generator to turn off the top selective gate corresponding to the first string address and turn on the top selective gate corresponding to the second string address, when the second string address is different from the first string address.

In some implementations, the first string address and the second string address are continuous addresses or random addresses.

In some implementations, the control logic circuit is further configured to control the voltage generator to restore the voltage applied to the word line corresponding to the first word line address to a low level after the end of the application of the first read voltage, when the second word line address in the second read request instruction is different from the first word line address. Then the control logic circuit controls the voltage generator to apply a pre-pulse voltage to the word line corresponding to the second word line address; and after the end of the application of the pre-pulse voltage, apply the second read voltage to the word line corresponding to the second word line address.

In some implementations, the control logic circuit is further configured to restore the voltage applied to the word line corresponding to the first word line address to a low level after the end of the application of the first read voltage, in response to the second read request instruction not being detected.

In some implementations, before the voltage generator is controlled to apply the first read voltage to the word line corresponding to the first word line address, the control logic circuit is further configured to control the voltage generator to apply a pre-pulse voltage to the word line corresponding to the first word line address.

In some implementations, the first read request instruction is for reading the first page; the second read request instruction is for reading the second page; the first read voltage includes a plurality of voltages of reading the first page; the second read voltage includes a plurality of voltages of reading the second page.

In another aspect, a method for reading memory is provided. The method includes applying a read voltage to the selected word line of the memory array, and applying a turn-on voltage to the unselected word line. The read voltage includes a first read voltage and a second read voltage. The second read voltage is applied after the end of the application of the first read voltage, and the second read voltage is adjacent to the first read voltage.

In some implementations, the first read voltage is for reading a first page; the second read voltage is for reading a second page; and the first page is adjacent to the second page.

In some implementations, after the end of the application of the first read voltage and before applying a second read voltage to the selected word line, there is no need to restore the voltage applied to the selected word line to a low level before applying the pre-pulse voltage.

In some implementations, during the process of applying the read voltage to the selected word line, the turn-on voltage applied to the unselected word line remains unchanged.

In still another aspect, a memory is provided. The memory includes a memory array and a peripheral circuit. The memory array includes a plurality of word lines and a plurality of bit lines. The peripheral circuit is coupled to the plurality of word lines and the plurality of bit lines. The peripheral circuit is configured to apply a read voltage to the selected word line of the memory array, and apply a turn-on voltage to the unselected word line. The read voltage includes a first read voltage and a second read voltage; the second read voltage is applied after the end of the application of the first read voltage, and the second read voltage is adjacent to the first read voltage.

In some implementations, the first read voltage is for reading a first page; the second read voltage is for reading a second page; and the first page is adjacent to the second page.

In some implementations, after the end of the application of the first read voltage and before applying a second read voltage to the selected word line, there is no need to restore the voltage applied to the selected word line to a low level before applying the pre-pulse voltage.

In some implementations, during the process of applying the read voltage to the selected word line of the memory array, the turn-on voltage applied to the unselected word line remains unchanged.

In yet another aspect, a memory system is provided, and the memory system includes a memory and a controller. The memory is the memory in any one of the aspects described above. The controller is coupled to the memory to control the memory to read data.

In yet another aspect, an electronic device is provided, and the electronic device includes the memory system described above.

It may be understood that beneficial effects achieved by the memory, memory system, and electronic device provided by the implementations of the present disclosure described above may refer to the beneficial effects of the method for reading memory in the first aspect above, which will not be repeated here.

BRIEF DESCRIPTION OF THE DRAWINGS

In order to illustrate the technical solutions in the present disclosure more clearly, the following will briefly introduce the accompanying drawings used in some implementations of the present disclosure. Apparently, the accompanying drawings in the following description are only drawings of some implementations of the present disclosure, and those skilled in the art can also obtain other drawings according to these accompanying drawings. In addition, the accompanying drawings in the following description may be regarded as schematic diagrams and are not limited to the actual size of the product, actual flows of methods, actual timings of signals, etc., involved in the implementations of the present disclosure.

DETAILED DESCRIPTION

Figure 1:
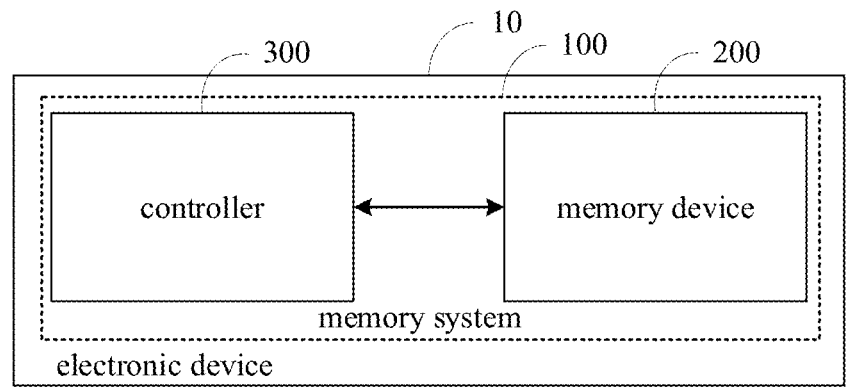
FIG. 1 is a schematic structure diagram of an electronic device.

The technical solutions in some implementations of the present disclosure will be clearly and completely described below in conjunction with the accompanying drawings, apparently, the described implementations are only some, not all of implementations of the present disclosure. All other implementations obtained by those skilled in the art based on the implementations provided in the present disclosure belong to the claimed scope of the present disclosure.

In the description of the present disclosure, unless the context requires otherwise, throughout the description and claims, the term "comprising" is interpreted as open and inclusive, i.e., "including, but not limited to". In the description of the present disclosure, the terms "one implementation," "some implementations," "exemplary implementation," "exemplary" or "some examples" are intended to indicate that a particular feature, structure, material, or characteristic related to the implementation or example is included in at least one implementation or example of the present disclosure. Illustrative representations of the terms described above are not necessarily referring to a same implementation or example. Furthermore, particular feature, structure, material or characteristic described above may be included in any suitable manner in any one or more implementations or examples.

Hereinafter, the terms "first" and "second" are used for descriptive purposes only, and should not be understood as indicating or implying relative importance or implicitly indicating the quantity of indicated technical features. Thus, a feature defined as "first" and "second" may explicitly or implicitly include one or more of these features. In the description of implementations of the present disclosure, "plurality" means two or more, unless specified otherwise.

In describing some implementations, the term "coupled" may be used to indicate that two or more elements are in direct physical or electrical contact. However, the term "coupled" may also mean that two or more elements are not in direct contact with each other, but yet still co-operate or interact with each other. Implementations disclosed herein are not necessarily limited by the context herein.

"At least one of A, B and C" has the same meaning as "at least one of A, B or C," and both include the following combinations of A, B, and C: only A; only B; only C; combination of A and B; combination of A and C; combination of B and C; and combination of A, B and C.

"A and/or B" includes the following three combinations: only A; only B; only C; and combination of A and B.

The use of "suitable for" or "configured to" herein means open and inclusive language that does not exclude devices that are suitable or configured to perform additional tasks or steps.

Additionally, the use of "based on" is meant to be open and inclusive, as a process, step, calculation, or other action that is "based on" one or more stated conditions or values may in practice be based on additional conditions or beyond the values.

The term "three-dimensional memory" refers to a semiconductor device formed by memory cell transistor strings arranged on the main surface of the substrate or the source layer, and extends along the direction of the substrate or the source layer vertically (referred to herein as "memory cell string," e.g., NAND memory cell string). As used herein, the term "vertical/vertically" means nominally vertical to the main surface (i.e., lateral surface) of the substrate or source layer. The string address is an address corresponding to the "memory cell string." The "selected word line" is a word line corresponding to the word line address in the instruction of read request. The "unselected word line" is some word line in word lines coupled to the memory cell string, other than the word line corresponding to the word line address in the instruction of read request.

As shown in FIG. 1, a memory system 100 is generally provided in an electronic device 10. The memory system 100 includes a memory 200 and a controller 300. The controller 300 is coupled to the memory 200, and data may be read from the memory 200 or written into the memory 200 through the controller 300.

It may be understood that the memory system 100 may also include a controller 300 and one or more memories 200, e.g., in an implementation, the controller 300 and a single memory 200 may be integrated into a memory card. Memory card may include PC card (PCMCIA, Personal Computer Memory Card International Association), compact flash card (called CF card), smart media card (called SM card), memory stick, multimedia card (MMC), secure digital card (called SD card), universal flash storage (UFS), etc. Among them, multimedia cards may be divided into MMC, reduced-size MMC (RS-MMC), MMCmicro, etc.; secure digital card includes SD, miniSD, microSD, secure digital high capacity (SDHC), etc. Further, a memory card may also include a memory card connector for coupling the memory card with the host. In another implementation, the controller 300 and multiple memories 200 may be integrated into a solid-state disk (SSD). An SSD may also include an SSD connector coupling the SSD to the host. In some implementations, the storage capacity and/or operating speed of SSD is greater than the storage capacity and/or operating speed of memory card. In addition, the electronic device described above may be any one of mobile phone, desktop computer, tablet computer, notebook computer, server, vehicle-mounted device, wearable device (e.g., smart watch, smart bracelet, smart glasses, etc.), mobile power supply, game console, digital multimedia player, etc., which is not specifically limited in implementations of the present disclosure.

Figure 2:
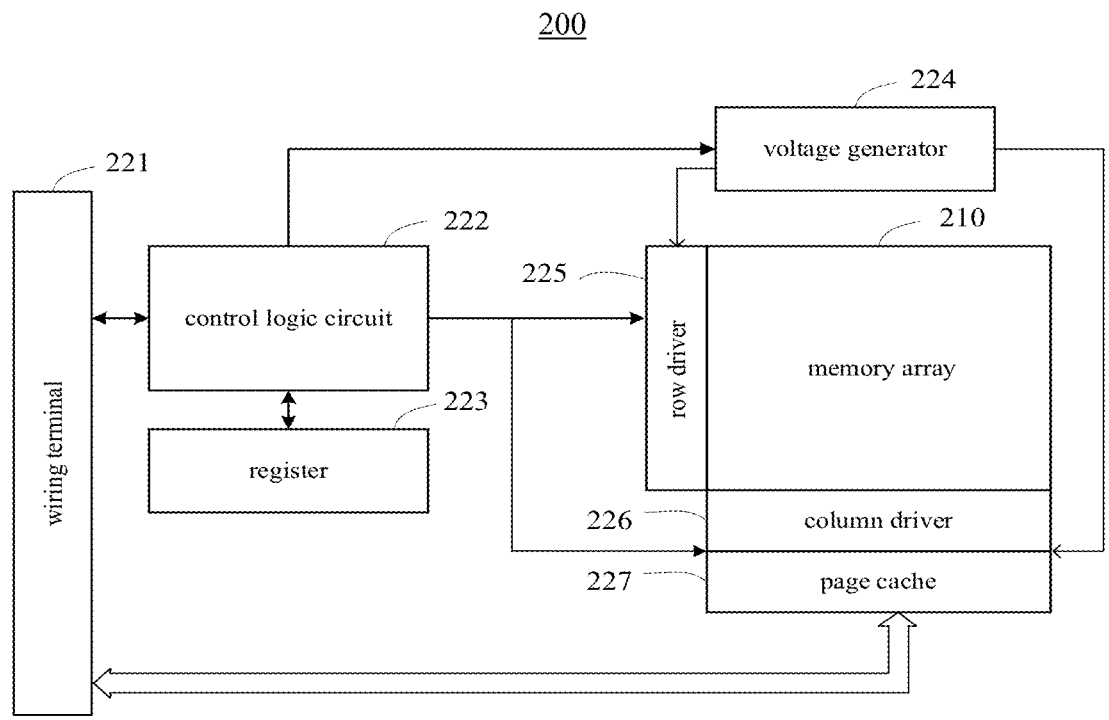
FIG. 2 is a schematic structure diagram of a memory.

As shown in FIG. 2, memory 200 generally includes memory array 210 and peripheral circuit. The peripheral circuit includes wiring terminal 221, control logic circuit 222, register 223, voltage generator 224, row driver 225, column driver 226, and page cache 227. Among them, the wiring terminal 221 is mainly used to receive read instructions and write instructions sent by the controller 300 and send the read data to the controller 300, etc. Control logic circuit 222 is mainly used to control the row driver 225 according to the received read instruction to turn on the voltage generator 224 and the corresponding word line, and control the column driver 226 to turn on the voltage generator 224 and the corresponding bit line, thereby reading corresponding data. The register 223 includes address register, state register, etc. The address register is used to store the word line address and string address in a read request instruction, etc. The state register is used to store the current state of the memory, including two states: ready and busy. When the control logic circuit 222 is reading data from or writing data into the memory array, the state stored in the state register is "busy," and the next read or write operation may not be performed. After the memory array completes the reading or writing process, the state stored in the state register is switched to "ready," and the next read or write operation may be performed. The page cache 227 includes a first register and a second register, wherein the first register is used for caching data read from the memory array, and the second register is used for caching data transferred from the first register.

Figure 3:
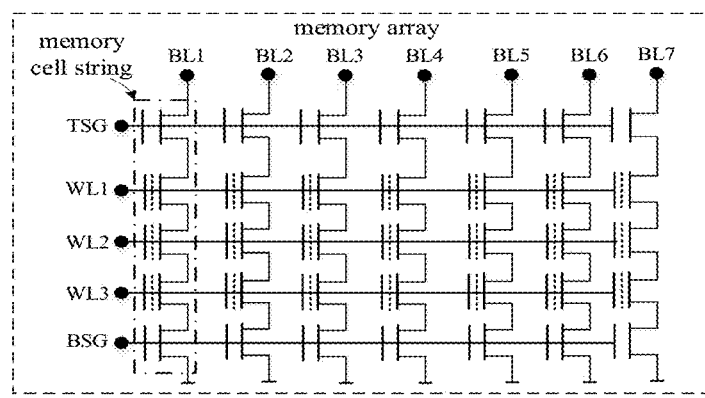
FIG. 3 is a schematic structure diagram of a memory array.

A memory array in a memory may include a plurality of memory cells arranged at intersections of word lines and bit lines. The memory may be divided into two-dimensional memory and three-dimensional memory according to the difference in the structure of memory array. As shown in FIG. 3, a plurality of memory cells on each bit line vertical to respective bit lines in the three-dimensional memory form a memory cell string. A top selection gate (TSG) is provided on the top of each memory cell string, and a bottom selection gate (BSG) is provided at the bottom. A plurality of memory cell strings are provided on each bit line, and each word line may be coupled to memory cells in the plurality of memory cell strings. The difference between a two-dimensional memory and a three-dimensional memory is that only one memory cell is in the memory cell string vertical to each bit line in a two-dimensional memory.

When data is to be read from the memory cell string, a turn-on voltage may be input to the top selective gate (TSG) and the bottom selective gate (BSG), respectively, so that the TSG and BSG are turned on, while a turn-on voltage is inputted to unselected memory cells, and then a read voltage is inputted to the corresponding bit line. In a three-dimensional memory, a memory cell may be divided into multiple pages (pages) according to the number of bits of data stored in the memory cell, wherein the number of pages is equal to the number of bits of data stored in the memory cell. For example, when the memory cell is a triple-level memory cell (TLC) flash memory particle, the data stored in each memory cell is in three bits, and a memory cell layer may be divided into three pages accordingly, including a low page (LP), a middle page (MP) and an up page (UP).

In a memory, a cache read is a pipelined read that allows one page to be read from the page cache 227 while another page is read from the memory array into the page cache 227. A three-dimensional memory may know the next cache read address before the current read is finished. Each of pages in the three-dimensional memory corresponds to a different read voltage, and when data is read from any memory cell layer of the three-dimensional memory, a read voltage corresponding to each of pages may be applied to a corresponding word line (WL) in the order of pages. After applying any read voltage corresponding to any page to the word line each time, the data of the corresponding bit stored in the memory cell may be determined according to the on state of each bit line (BL) under different read voltages. In this way, after the read voltage corresponding to each of pages is applied to the word lines, read results may be determined according to determined data of each of the bits stored in memory cells.

However, during a cache read, each page is read completely independently. All word lines in the same block may be pre-charged before sensing and reading, and then voltages applied to all word lines are released after sensing is finished. But for a same word line with the same character string read, voltages applied to other word lines are actually exactly the same, except that the selected word line is different. For the read process of a same word line and different strings, only the voltage of the selected word line is different from the bias voltage of the top selective gate of the string, without releasing the voltage applied to all word lines during the process of cache read.

Figure 4:
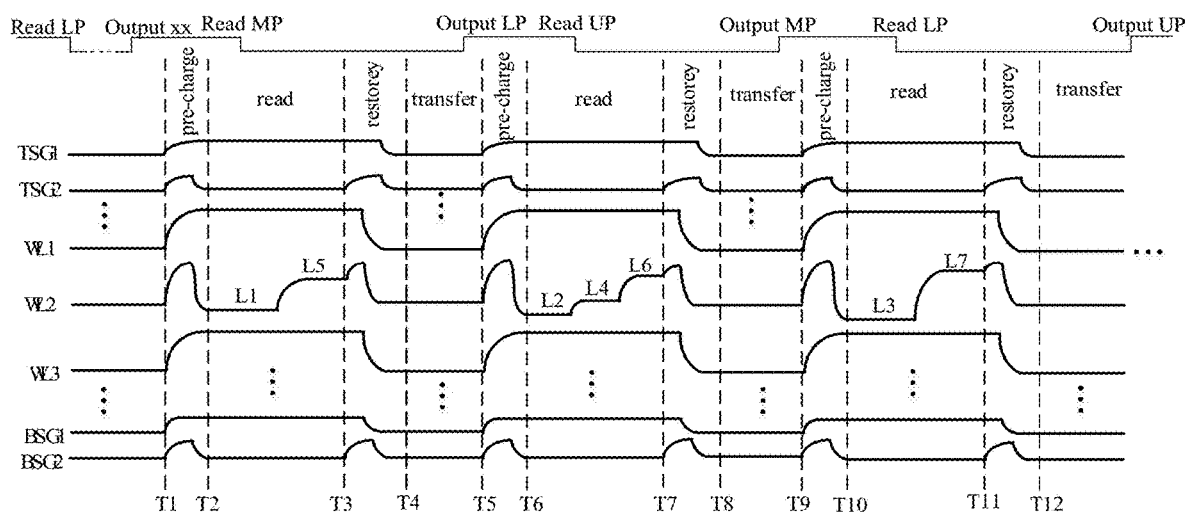
FIG. 4 is a cache read control timing diagram.

As illustrated, taking the memory cell array in FIG. 3 as an example, when the traditional method of cache read is employed for reading, if a new read request instruction is received at the end of the last read operation, i.e., to read the low page (LP) of the word line WL2, the word line WL2 is sequentially read, the read timing is shown in FIG. 4.

At time T1, when the word line WL2 is read, a pre-charge operation is performed firstly, i.e., pre-pulse voltage is applied to all of word lines (WL1~WL3), bit lines (BL1~BL7), top selective gates (TSG1, TSG2) and bottom selective gates (BSG1, BSG2) of the block to which the word line WL2 belongs.

Before the T1 time, the data of the page read at the end of the last read operation (i.e., "output xx") may also be output first, because the reading may be in the manner of read in order or random, therefore, "xx" may correspond to any one of an up page (UP), a middle page (MP), and a low page (LP), which is not specifically limited in implementations of the present disclosure.

At time T2, the voltage applied to the unselected top selective gate (TSG2) is released, a turn-on voltage is applied to unselected word lines (WL1, WL3), and start to apply read voltages L1 and L5 to selected word line (WL2) step by step, to read the low page (LP).

At time T3, a turn-on voltage is applied to the selected word line (WL2), the unselected top selective gate (TSG2), and the unselected bottom selective gate (BSG2), so as to clear the channel of the corresponding memory cell string.

At time T4, before releasing each of the applied voltages, the block to which the word line WL2 belongs is restored to an initial state.

The time from T4 to T5 is a transfer stage, to transfer the low page (LP) stored in the first register in the page cache to the second register, and then output the low page (LP); and detect whether there is a new read request instruction.

At time T5, a new read instruction is detected, and a pre-pulse voltage is again applied to all word lines (WL1~WL3), bit lines (BL1~BL7), top selective gates (TSG1, TSG2) and bottom selective gates (BSG1, BSG2) of the block to which the word line WL2 belongs.

At time T6, the voltage applied to the unselected top selective gate (TSG2) is released, a turn-on voltage is applied to unselected word lines (WL1, WL3), and start to apply read voltages L2, L4, and L6 to selected word line (WL2) step by step, and read the middle page (MP).

At time T7, a turn-on voltage is applied to the selected word line (WL2), the unselected top selective gate (TSG2), and the unselected bottom selective gate (BSG2).

At time T8, each of the applied voltages is released, and the block to which the word line WL2 belongs is restored to an initial state.

The time from T8 to T9 is a transfer stage, to transfer the middle page (MP) data stored in the first register in the page cache to the second register, and then output the middle page (MP); and detect whether there is a new read request instruction.

At time T9, a new read instruction is detected, and a pre-pulse voltage is applied again to all word lines (WL1~WL3), bit lines (BL1~BL7), top selective gates (TSG1, TSG2) and bottom selective gates (BSG1, BSG2) of the block to which the word line WL2 belongs.

At time T10, the voltage applied to the unselected top selective gate (TSG2) is released, a turn-on voltage is applied to unselected word lines (WL1, WL3), and start to apply read voltages L3 and L7 to selected word line (WL2) step by step, and read the up page (UP).

At time T11, a turn-on voltage is applied to the selected word line (WL2), the unselected top selective gate (TSG2), and the unselected bottom selective gate (BSG2).

At time T12, each of the applied voltages is released, and the block to which the word line WL2 belongs is restored to an initial state. Then the up page (UP) stored in the first register in the page cache is transferred to the second register, and the up page (UP) is outputted; and detects whether there is a new read request instruction.

It may be seen from the above that the pre-pulse voltage and the turn-on voltage in restoring may be applied to read of each of the pages. But applying the pre-pulse voltage and the turn-on voltage in restoring will increase read time, thereby increasing the power consumption in reading.

Figure 5:
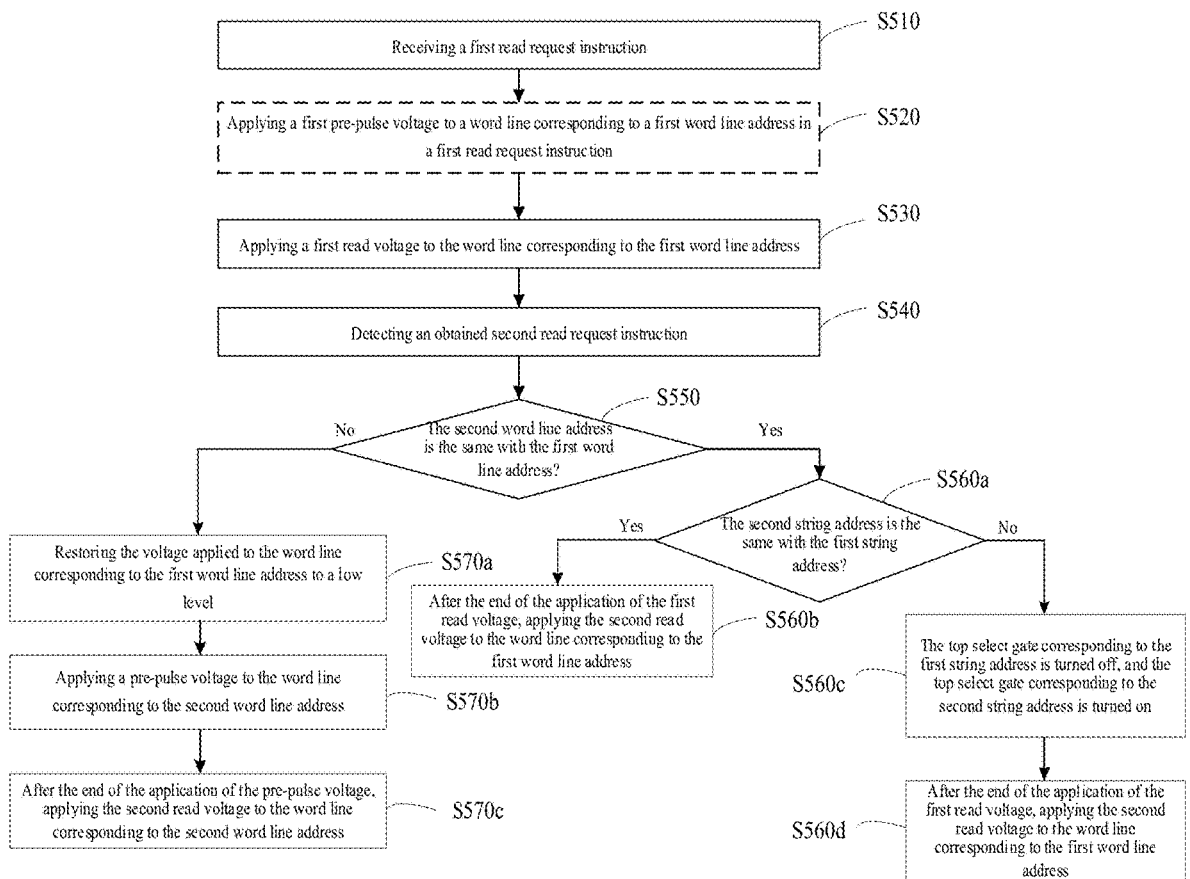
FIG. 5 is a schematic flowchart of a method for reading memory provided by an implementation of the present disclosure.

As shown in FIG. 5, in order to solve the problems described above, the present disclosure provides a method for reading memory, which may be used to peripheral circuits of a memory, and the overall process of the method is as follows:

S510. Receiving a first read request instruction.

Wherein the first read request instruction is received by the control logic circuit. The first read request instruction may include a first block address, a first word line address, a first string address, etc., corresponding to the data read at this time. The first read request instruction may be an instruction sent by the controller in FIG. 1 to the control logic circuit 222 in the memory.

It may be understood that the information included in the first read request instruction can be adjusted according to actual needs and is not limited to the above content.

S520. Applying a pre-pulse voltage to a word line corresponding to the first word line address in a first read request instruction.

In an implementation, after obtaining the first read request instruction, the control logic circuit 222 may decode the first read request instruction to obtain the information, such as the corresponding first word line address, first string address, etc., and store them in an address register; then control the voltage generator to apply corresponding pre-pulse voltages to each of word lines, each of top selective gates, and each of bottom selective gates of the block to which the word line corresponding to the first word line address belongs.

It should be noted that the steps described above are optional steps, which are to be performed when the first read request instruction is an initial read request instruction for the word line corresponding to the first word line address.

S530. Applying a first read voltage to the word line (i.e., the selected word line) corresponding to the first word line address in the first read request instruction (i.e., applying the read voltage to the selected word line of the memory array).

The first read request instruction is for reading the first page on the corresponding word line, the at least one first read voltage includes multiple voltages of reading the first page, and the multiple voltages are applied step by step from small to large during the application. When applying the first read voltage to the word line corresponding to the first word line address in the first read request instruction, it is to control the voltage generator to apply a turn-on voltage to the corresponding top selective gate and bottom selective gate. In addition, a turn-on voltage is applied to other word lines (i.e., apply a turn-on voltage to an unselected word line) to make the memory cell string turn on.

It may be understood that, if the first read request instruction is an initial read request instruction on the corresponding word line, then before applying a read voltage to the word line corresponding to the first word line address, a pre-pulse voltage may be applied to the memory array, so as to suppress the problem of hot carrier injection (HCI) problem in the three-dimensional memory.

The row driver 225, the column driver 226, and the voltage generator 224 may be controlled by the control logic circuit 222, so as to simultaneously apply the pre-pulse voltage to each of word lines, top selective gates, etc., of the block to which the corresponding word line belongs.

As illustrated, when applying the pre-pulse voltage, the control logic circuit 222 may control the row driver 225 to turn on each of the word lines, top selective gates, bottom selective gates, etc., of the block to which the corresponding word line belongs and the voltage generator 224; while control the column driver 226 to turn on each of bit lines of the block to which the corresponding word line belongs and voltage generator 224 to which the pre-pulse voltage is uniformly applied by the voltage generator.

It may be understood that the way for the application of a specific pre-pulse voltage may also employ other commonly used methods for the application of the pre-pulse voltage, which are not specifically limited in implementations of the present disclosure.

S540. Detecting an obtained second read request instruction.

The first read request instruction is for reading a first page; the second read request instruction is for reading a second page. The first page and the second page may be two adjacent pages on the same word line, or two non-adjacent pages on the same word line, or the first page and the second page may also be two non-adjacent pages on the same word line.

In an implementation, the control logic circuit 222 may detect whether there is a second read request instruction sent by the controller during the process of controlling the voltage generator 224 to apply the first read voltage to the corresponding word line. If the second read request instruction is detected, continue to S550, otherwise, after the end of the application of the first read voltage, the voltage applied to the word line corresponding to the first word line address is restored to a low level, and the read operate ends. In the process of restoring the voltage applied to the word line corresponding to the first word line address to a low level, a high level may also be first applied to the word line corresponding to the first word line address to clear the channel of the memory cell string, and then restore to the low level.

In this way, compared with a traditional read method in which the voltage applied to the word line corresponding to the first word line address is first restored to a low level after the end of the application of the first read voltage, and then whether there is a new read request instruction is detected, the operation frequency of the voltage generator 224 may be reduced in the case where the word line addresses corresponding to the previous and subsequent read request instructions are the same. Therefore the service life of the voltage generator 224 may be increased.

S550. Determining whether the second word line address included in the second read request instruction is the same as the first word line address.

In an implementation, after the second read request instruction is detected, the control logic circuit 222 may firstly decode the second read request instruction to obtain information such as the corresponding second word line address and the second string address, etc., then compare the second word line address with the first word line address in the address register to determine whether they are the same.

When the second word line address included in the second read request instruction is the same as the first word line address, applying a second read voltage to the word line corresponding to the first word line address after the end of the application of the first read voltage.

In an implementation, if the second word line address is the same as the first word line address, the second string address included in the second read request instruction and the first string address included in the first read request instruction may be compared, and then the voltage generator 224 is controlled to apply the second read voltage to the corresponding word line according to the comparison result, the specific content is as follows.

S560a. Determining whether the second string address is the same as the first string address.

S560b. If the second string address is the same as the first string address, then after the end of the application of the first read voltage, the second read voltage to the word line corresponding to the first word line address is applied; otherwise, S560c is performed.

Specifically, the page cache 227 may include a first register and a second register; and after the end of the application of the first read voltage, the read data is stored in the first register. When being output, the data in the first register may be transferred to the second register before being output, and then the control logic circuit 222 switches the "busy" state in the state register to the "ready" state, and calculates the second read voltage needs to be applied according to the second read request instruction.

S560c. If the second string address is different from the first string address, the top selective gate corresponding to the first string address is turned off, and the top selective gate corresponding to the second string address is turned on, then S560d is performed.

The control logic circuit 222 may control the row driver 225 to turn on the voltage generator 224 and the corresponding top selective gate, and then control the voltage generator 224 to input a high level to the top selective gate, so that the top selective gate is turned on; when the top selective gate is to be turned off, the row driver 225 is controlled to disconnect the voltage generator 224 from the corresponding top selective gate.

It may be understood that when the top selective gate is to be turned off, the voltage generator 224 may also be controlled to output a low level to the corresponding top selective gate.

S560d. After the end of the application of the first read voltage, the second read voltage to the word line corresponding to the first word line address is applied.

The second read voltage may include multiple voltages to be applied when the second page is read. The quantity and values of voltages in the second read voltage are determined by the second read request instruction.

In the implementation process described above, the control logic circuit in the peripheral circuit implements the application of each of turn-on voltages and read voltages through controlling the voltage generator. When the word line addresses included in the first request instruction and the second request instruction are the same, the second read voltage is applied after the end of the application of the first read voltage, and the second read voltage is adjacent to the first read voltage. After the end of the application of the first read voltage and before applying a second read voltage to the selected word line, there is no need to restore the voltage applied to the selected word line to a low level before applying the pre-pulse voltage, while in the process of applying the read voltage to the selected word line, the turn-on voltage applied to the unselected word line remains unchanged, thereby the read time for the same word line is reduced.

In an implementation, if the second word line address in the second read request instruction is different from the first word line address, the word line may be switched, and the second read voltage may be applied to the word line corresponding to the second word line address. The details are as follows.

S570a. When the second word line address in the second read request instruction is different from the first word line address, the voltage applied to the word line corresponding to the first word line address to a low level is restored after the end of the application of the first read voltage.

The voltage applied to the word line corresponding to the first word line address may be restored to a low level after the end of the application of the first read voltage. In addition, when restoring the voltage applied to the word line corresponding to the first word line address to a low level, it is to restore the turn-on voltage applied to the turned-on top selective gate and the bottom selective gate to a low level.

Optionally, a short-time high voltage may be first applied to the word line corresponding to the first word line address, and then restored to a low level, so as to clear the channel corresponding to the memory cell string.

S570b. a pre-pulse voltage is applied to the word line corresponding to the second word line address.

After applying the pre-pulse voltage to the word line corresponding to the second word line address, it is to apply the pre-pulse voltage to other word lines, top selective gates and bottom selective gates of the block to which the word line corresponding to the second word line address belongs, and the applied pre-pulse voltage may effectively reduce the damage caused by hot carrier injection to the memory cell.

S570c. After the end of the application of the pre-pulse voltage, the second read voltage is applied to the word line corresponding to the second word line address.

When applying the second read voltage to the word line corresponding to the second word line address, multiple read voltages may be applied step by step from small to large according to the target page to be read.

In the implementation process described above, the process of applying the read voltage to the word line corresponding to the word line address in each of read request instructions is to apply the read voltage to the selected word line, and the process of applying the turn-on voltage to other word lines is to apply a turn-on voltage to unselected word lines.

In order to facilitate understanding of the provided implementations of the present disclosure, the present disclosure takes the memory array in FIG. 4 as an example to describe the reading method of the present disclosure.

Figure 6:
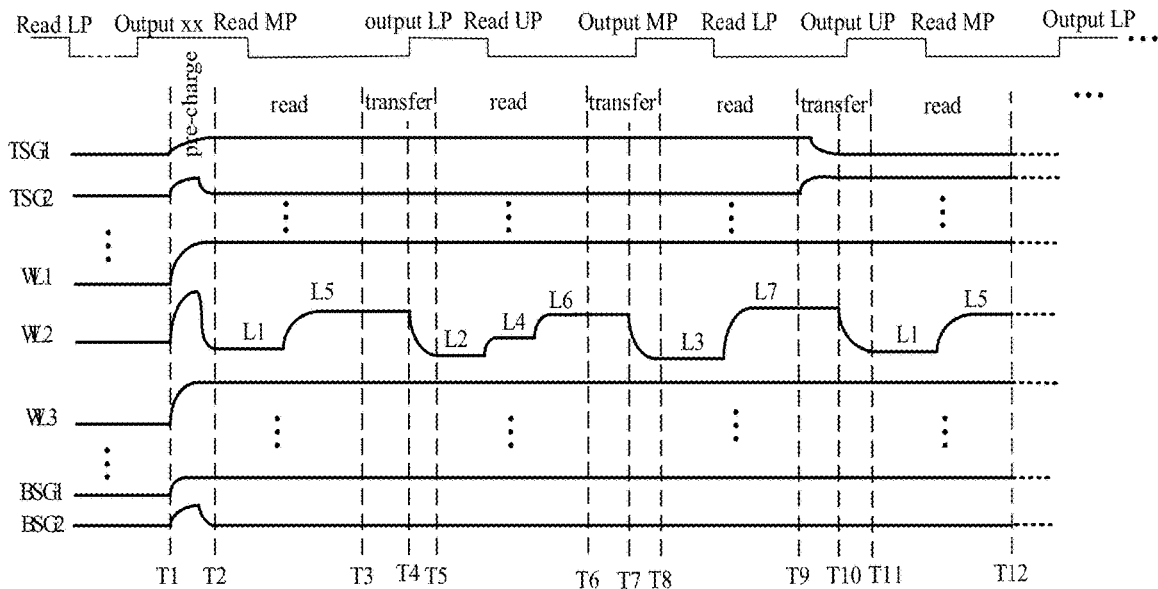
FIG. 6 is a timing diagram of controlling of memory read provided by an implementation of the present disclosure.

As shown in FIG. 6, if the structure of the memory cell is TLC, the reading method employs the way of reading in order, and the word line address and string address of each of reading request instructions are the same, and a read request instruction was input during the last read process to read the low page on the word line WL2 (i.e., read LP), the subsequent read timing is as follows.

At time T1, after a first read request instruction to read LP is detected, the pre-charge operation is performed first, i.e., a pre-pulse voltage is applied first to all word lines (WL1~WL3), top selective gates (TSG1, TSG2) and bottom selective gates (BSG1, BSG2), etc., of the block to which the word line belongs.

Wherein, before the T1 time, the data of the page read at the end of the last read process (i.e., "output xx") may also be output first because the way of reading may be reading in order or random. Therefore, "xx" may correspond to any one of an up page (UP), a middle page (MP), and a low page (LP) of any word line, which is not specifically limited in implementations of the present disclosure.

At time T2, after the end of the application of the pre-pulse voltage, the corresponding read voltages L1 and L5 are applied step by step from low to high when LP is read (i.e., the first read voltage is applied), and the data of the low page (LP) is read.

During this process, a second read request instruction (i.e., read MP) may be received.

At time T3, after the application of the read voltage L5 ends (i.e., the end of the application of the first read voltage), it may be detected whether a new read request instruction is obtained.

The time between time T3 and time T5 is a transfer stage, because the obtained second read request instruction (i.e., read MP) is detected at time T3. Thus the second word line address included in the second read request instruction may be compared with the first word line address, and the second string address included in the second read request instruction may be compared with the first string address. After the comparison, it is determined that the second word line address included in the second read request instruction is the same as the first word line address (both are WL2), and the second string address included in the second read request instruction is the same with the first string address (both are TSG0).

At time T4, the voltage applied to the first word line (WL2) is restored to the initial voltage L2 of the second read request instruction, and the data of the low page (LP) is transferred from the first register of the page cache 227 to the second register and then output. The voltage applied to the first word line (WL2) from time T3 to time T4 remains at L5.

At time T5, the read voltages L2, L4, and L6 are applied step by step from the initial voltage L2 (i.e., the second read voltage is applied), and the data of the middle page (MP) is read.

During this process, a third read request instruction (i.e., read UP) may be received.

At time T6, the application of the read voltage L6 ends, and it may be detected whether a new read request instruction is obtained.

The time between time T6 and time T8 is a second transfer stage, because the obtained third read request instruction (i.e., read UP) is detected at time T6. Thus the third word line address included in the third read request instruction may be compared with the second word line address, and the third string address included in the third read request instruction may be compared with the second string address. At this point, it is determined that the third word line address included in the third read request instruction is the same as the second word line address (both are WL2), and the third string address included in the third read request instruction is the same with the second string address (both are TSG0).

At time T7, the voltage applied to the first word line (WL2) is restored to the initial voltage L3 of the third read request instruction, and the data of the middle page (MP) is transferred from the first register of the page cache 227 to the second register and then output. The voltage applied to the first word line (WL2) from time T6 to time T7 remains at L6.

At time T8, the read voltages L3 and L7 are applied step by step from the initial voltage L3 (i.e., the third read voltage is applied), and the data of the up page (UP) is read.

During this process, a fourth read request instruction (i.e., read LP) may be received.

At time T9, the application of the read voltage L7 ends (i.e., the application of the third read voltage ends), and it may be detected whether a new read request instruction is obtained.

The time between time T9 and time T11 is a third transfer stage, because the obtained fourth read request instruction (i.e., read LP) is detected at time T9. Thus the fourth word line address included in the fourth read request instruction may be compared with the third word line address, and the third string address included in the fourth read request instruction may be compared with the third string address. At this point, it is determined that the fourth word line address included in the fourth read request instruction is the same as the third word line address (both are WL2), but the fourth string address included in the fourth read request instruction is different from the third string address (switched from TSG0 to TSG1). Thus a turn-on voltage may be applied to TSG1, and then the voltage applied to TSG0 may be released.

At time T10, the voltage applied to the first word line (WL2) is restored to the initial voltage L1 of the fourth read request instruction, and the data of the up page (UP) is transferred from the first register of the page cache 227 to the second register and then output. The voltage applied to the first word line (WL2) from time T9 to time T10 remains at L7.

At time T11, the read voltages L1 and L5 are applied step by step from the initial voltage L1 (i.e., the fourth read voltage is applied), and the data of the low page (LP) corresponding to the fourth read request instruction is read.

At time T12, after the application of the fourth read voltage ends, and then whether there is a new read request instruction may be detected. If there is no new read request instruction, the data of the low page (LP) is transferred from the first register to the second register and then output.

It may be understood that the implementations described above only take TLC as an example to illustrate the solution of the present disclosure. The quantity and values of voltages applied step by step in the reading voltage described above may be accordingly adjusted according to the type of the memory cell.

Figure 7:
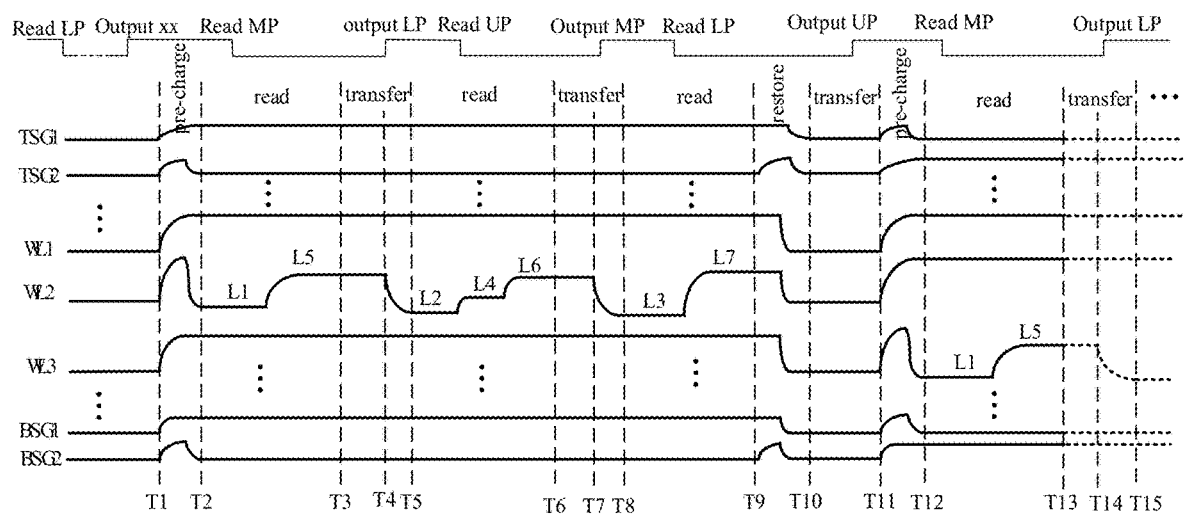
FIG. 7 is another timing diagram of controlling of memory read provided by an implementation of the present disclosure.

As shown in FIG. 7, if the structure of the memory cell is TLC, the address of the read word line changes during the process of reading data, and a read request instruction was input during the last read process to read the low page on the word line WL2 (i.e., read LP), the subsequent read timing is as follows.

At time T1, after a first read request instruction to read LP is detected, the pre-charge operation is performed firstly, i.e., a pre-pulse voltage is applied first to all word lines (WL1~WL3), top selective gates (TSG1, TSG2) and bottom selective gates (BSG1, BSG2), etc., of the block to which the word line belongs.

Wherein, before the T1 time, the data of the page read at the end of the last read process (i.e., "output xx") may also be output first, because the way of reading may be reading in order or random. Therefore, "xx" may correspond to any one of an up page (UP), a middle page (MP), and a low page (LP) of any word line, which is not specifically limited in implementations of the present disclosure.

At time T2, after the application of the pre-pulse voltage ends, the corresponding read voltages L1 and L5 are applied step by step from low to high when LP is read (i.e., the first read voltage is applied), and the data of the low page (LP) is started to be read.

During this process, a second read request instruction (i.e., read MP) may be received.

At time T3, after the application of the read voltage L5 ends (i.e., the end of the application of the first read voltage), it may be detected whether a new read request instruction is obtained.

The time between time T3 and time T5 is a transfer stage, because the obtained second read request instruction (i.e., read MP) is detected at time T3. Thus the second word line address included in the second read request instruction may be compared with the first word line address, and the second string address included in the second read request instruction may be compared with the first string address. After the comparison, it is determined that the second word line address included in the second read request instruction is the same as the first word line address (both are WL2), and the second string address included in the second read request instruction is the same with the first string address (both are TSG0).

At time T4, the voltage applied to the first word line (WL2) is restored to the initial voltage L2 of the second read request instruction, and the data of the low page (LP) is transferred from the first register of the page cache 227 to the second register and then output. The voltage applied to the first word line (WL2) from time T3 to time T4 remains at L5.

At time T5, the read voltages L2, L4, and L6 are applied step by step from the initial voltage L2 (i.e., the second read voltage is applied), and the data of the middle page (MP) is started to be read.

During this process, a third read request instruction (i.e., read UP) may be received.

At time T6, after the application of the read voltage L6 ends, it may be detected whether a new read request instruction is obtained.

The time between time T6 and time T8 is a second transfer stage, because the obtained third read request instruction (i.e., read UP) is detected at time T6. Thus the third word line address included in the third read request instruction may be compared with the second word line address, and the third string address included in the third read request instruction may be compared with the second string address. At this point, it is determined that the third word line address included in the third read request instruction is the same as the second word line address (both are WL2), and the third string address included in the third read request instruction is the same with the second string address (both are TSG0).

At time T7, the voltage applied to the second word line (WL2) is restored to the initial voltage L3 of the third read request instruction, and the data of the middle page (MP) is transferred from the first register of the page cache 227 to the second register and then output. The voltage applied to the second word line (WL2) from time T6 to time T7 remains at L6.

At time T8, the read voltages L3 and L7 are applied step by step from the initial voltage L3 (i.e., the third read voltage is applied), and the data of the up page (UP) is started to be read.

During this process, a fourth read request instruction (i.e., read LP) may be received.

At time T9, after the application of the read voltage L7 ends (i.e., the application of the third read voltage ends), it may be detected whether a new read request instruction is obtained.

Since a fourth read request instruction is detected, the fourth word line address included in the fourth read request instruction may be compared with the third word line address, and the third string address included in the fourth read request instruction may be compared with the third string address. At this time, if it is determined that the fourth word line address included in the fourth read request instruction is different from the third word line address (switched from WL2 to WL3), then the voltages applied by the voltage generator 224 to the block to which the first word line belongs are gradually restored to the low level.

The selected word line (WL2), the selected top selective gate (TSG1), the selected bottom selective gate (BSG1), and the unselected word lines (WL1, WL3) all restored to the low level from the corresponding turn-on voltage; and the unselected top selective gate (TSG2) and the unselected bottom selective gate (BSG2) are both input a high level first, and then restored from the high level to the low level, so as to clear the channel of the memory cell string to which the top selective gate (TSG1) belongs.

Optionally, the selected word line (WL2) may also be input a high level first, and then restored from the high level to the low level, so as to better clear the channel of the memory cell string to which the top selective gate (TSG1) belongs.

At time T10, the voltages applied to the block where the first word line is located are all restored to the low level.

The time between time T10 and time T11 is a third transfer stage, during which the data of the up page (UP) is transferred from the first register of the page cache 227 to the second register and then output.

At time T11, a pre-pulse voltage is input again to all word lines (WL1~WL3), top selective gates (TSG1, TSG2), and bottom selective gates (BSG1, BSG2), est., of the block to which the word line (WL3) corresponding to the fourth word line address belongs.

At time T12, the read voltages L1 and L5 are applied (i.e., the fourth read voltage is applied) step by step to the word line (WL3) corresponding to the fourth read request instruction, while a turn-on voltage is applied to the corresponding top selective gate (TSG2), bottom selective gate (BSG2) and other word lines (WL1, WL2, etc.), thereby the data of the low page (LP) corresponding to the fourth read request instruction is read.

At time T13, reading of the data corresponding to the fourth read request instruction has been finished, and then whether a new read request instruction is detected.

If there is no new read request instruction, the data of the low page (LP) is transferred from the first register to the second register and then output.

If a new read request instruction is detected, the voltage at the end of the last read is started to be released at time T14, and the voltage is reduced to the initial voltage corresponding to the next read request instruction at time T15. And after the end of the application of a complete reading voltage, the data of the low page (LP) from the page cache 227 is transferred from the first register to the second register for the output.

It may be understood that the process for implementation described above is only an example implementation provided by implementations of the present disclosure, and the voltages of the top selective gate, the bottom selective gate, and the word line may be accordingly adjusted according to the actual read request instruction. In addition, the read voltage may also be adjusted according to the type of the memory cell, and is not limited to the implementations described above.

It can be seen from the implementations described above that if the method of reading in order is employed, when reading data for read request instructions with the same word line, there is only one period for applying the pre-pulse voltage and one period for inputting the turn-on voltage during restoring, assuming that there are 6 rows of memory cell strings on each word line, if the read time of each of pages in the triple-level memory cell is 40 us, the period for applying pre-pulse voltage and inputting the turn-on voltage during restoring are 14 us per page, the period for discharging of the top selective gate and setting the turn-on voltage is 4 us per page, and 5 times for discharging of the top selective gate and setting the turn-on voltage. Compared with the reading method, the read time of each word line saves 30.2% of the read time, calculated as (14 us*17−4*5)/(40 us*18)*100%=30.2%.

If the read time of each page in the quad-level memory cell (QLC) is 85 us, the period for applying pre-pulse voltage and inputting the turn-on voltage during restoring is 14 us per page, the period for discharging of the top selective gate and setting the turn-on voltage is 4 us per page. When the method of reading in order is employed to perform data read for read request instructions with the same word line, there is only one time for applying the pre-pulse voltage and inputting the turn-on voltage during restoring, and 5 times for discharging of the top selective gate and setting the turn-on voltage. Compared with the reading method, the read time of each word line saves 14.8% of the read time, calculated as (14 us*23−4*5)/(85 us*24)*100%=14.8%.

Similarly, when the memory cell is a single-level memory cell (SLC) or a multi-level memory cell (MLC), a lot of read time may also be saved.

Further, the way for reading the two-dimensional memory is the same as that of the same word line. Thus, the reading method of the present disclosure is also applicable to a two-dimensional memory.

It may be understood that when the method of random reading is employed for reading, the reading method of the present disclosure may also reduce the read time. For example, if the word line address and the string address corresponding to the previous and subsequent read request instructions are the same, then one time for applying a pre-pulse voltage, one time for discharging the top selective gate and setting the turn-on voltage, and one time for restoring the applied voltage to a low level may be saved. If the word line addresses corresponding to the previous and subsequent read request instructions are the same, but the string addresses are different, one time for applying a pre-pulse voltage and one time for restoring the applied voltage to a low level may be saved.

The above is only specific implementations of the present disclosure, but the claimed scope of the present disclosure is not limited thereto, and changes or substitutions within the technical scope disclosed in the present disclosure that may be easily conceived by those skilled in the art shall fall within the claimed scope of the present disclosure. Therefore, the claimed scope of the present disclosure should be determined by the claimed scope of the claims.

What is claimed is:

1. A method for reading memory, comprising:
applying at least one first read voltage to a word line corresponding to a first word line address in a first read request instruction;
detecting an obtained second read request instruction; and
in response to a second word line address included in the second read request instruction being the same as the first word line address, applying at least one second read voltage to the word line corresponding to the first word line address after an end of application of the at least one first read voltage.

2. The method of claim 1, wherein
the first read request instruction further includes a first string address;
the second read request instruction further includes a second string address; and
before applying the at least one second read voltage to the word line corresponding to the first word line address and after the end of the application of the at least one first read voltage, the method further comprises determining that the second string address is the same as the first string address.

3. The method of claim 1, wherein
the first read request instruction further includes a first string address;
the second read request instruction further includes a second string address; and
before applying the at least one second read voltage to the word line corresponding to the first word line address, the method further comprises:
when the second string address is different from the first string address, turning off a top selective gate corresponding to the first string address, and turning on the top selective gate corresponding to the second string address.

4. The method of claim 3, wherein the first string address and the second string address are continuous addresses or random addresses.

5. The method of claim 1, further comprising:
when the second word line address in the second read request instruction is different from the first word line address, restoring the voltage applied to the word line corresponding to the first word line address to a low level after the end of the application of the at least one first read voltage;
applying a pre-pulse voltage to the word line corresponding to the second word line address; and
after the end of the application of the pre-pulse voltage, applying the at least one second read voltage to the word line corresponding to the second word line address.

6. The method of claim 5, wherein, after the end of the application of the at least one first read voltage and before applying the at least one second read voltage to the word line corresponding to the first word line address, there is no need to restore the voltage applied to the word line corresponding to the first word line address to a low level before applying the pre-pulse voltage.

7. The method of claim 1, further comprising:
in response to the second read request instruction not being detected, restoring the voltage applied to the word line corresponding to the first word line address to a low level after the end of the application of the at least one first read voltage.

8. The method of claim 1, further comprising:
before applying the at least one first read voltage to the word line corresponding to the first word line address, applying a pre-pulse voltage to the word line corresponding to the first word line address.

9. The method of claim 1, wherein
the first read request instruction is for reading a first page;
the second read request instruction is for reading a second page;
the at least one first read voltage includes voltages of reading the first page; and
the at least one second read voltage includes voltages of reading the second page.

10. A memory, comprising:
a memory array including word lines and bit lines; and
a peripheral circuit coupled to the word lines and the bit lines, and configured to:
apply at least one first read voltage to a word line corresponding to a first word line address in a first read request instruction;
detect an obtained second read request instruction; and
in response to a second word line address included in the second read request instruction being the same as the first word line address, apply at least one second read voltage to the word line corresponding to the first word line address after an end of application of the at least one first read voltage.

11. The memory of claim 10, wherein
the peripheral circuit comprises a control logic circuit and a voltage generator;
the control logic circuit is configured to receive a first read request instruction and control the voltage generator to apply the at least one first read voltage to a word line corresponding to a first word line address in the first read request instruction; and
the control logic circuit is further configured to:
detect the obtained second read request instruction; and
when the second word line address included in the second read request instruction is the same as the first word line address, control the voltage generator to apply the at least one second read voltage to the word line corresponding to the first word line address after the end of the application of the at least one first read voltage.

12. The memory of claim 11, wherein
the first read request instruction further includes a first string address;
the second read request instruction further includes a second string address; and
after the end of the application of the at least one first read voltage and before controlling the voltage generator to apply the at least one second read voltage to the word line corresponding to the first word line address, the control logic circuit is further configured to determine that the second string address is the same as the first string address.

13. The memory of claim 11, wherein
the first read request instruction further includes a first string address;
the second read request instruction further includes a second string address; and
before controlling the voltage generator to apply the at least one second read voltage to the word line corresponding to the first word line address, the control logic circuit is further configured to when the second string address is different from the first string address, control the voltage generator to turn off a top selective gate corresponding to the first string address, and turn on the top selective gate corresponding to the second string address.

14. The memory of claim 13, wherein the first string address and the second string address are continuous addresses or random addresses.

15. The memory of claim 11, wherein
the control logic circuit is further configured to, when the second word line address in the second read request instruction is different from the first word line address, restore the voltage applied to the word line corresponding to the first word line address to a low level after the end of the application of the at least one first read voltage; and
the control logic circuit is further configured to:
control the voltage generator to apply a pre-pulse voltage to the word line corresponding to the second word line address; and
after the end of the application of the pre-pulse voltage, apply the at least one second read voltage to the word line corresponding to the second word line address.

16. The memory of claim 11, wherein the control logic circuit is further configured to, in response to the second read request instruction not being detected, restore the voltage applied to the word line corresponding to the first word line address to a low level after the end of the application of the at least one first read voltage.

17. The memory of claim 11, wherein, before controlling the voltage generator to apply the at least one first read voltage to the word line corresponding to the first word line address, the control logic circuit is further configured to control the voltage generator to apply a pre-pulse voltage to the word line corresponding to the first word line address.

18. The memory of claim 10, wherein
the first read request instruction is for reading a first page;
the second read request instruction is for reading a second page;
the at least one first read voltage includes voltages of reading the first page; and
the at least one second read voltage includes voltages of reading the second page.

19. A memory system, comprising:
a memory comprising:
  a memory array including word lines and bit lines; and
  a peripheral circuit coupled to the word lines and the bit lines, and configured to:
    apply at least one first read voltage to a word line corresponding to a first word line address in a first read request instruction;
    detect an obtained second read request instruction; and
    in response to a second word line address included in the second read request instruction being the same as the first word line address, apply at least one second read voltage to the word line corresponding to the first word line address after an end of application of the at least one first read voltage; and
a controller coupled to the memory to control the memory to read data.

20. The memory system of claim 19, wherein
the peripheral circuit comprises a control logic circuit and a voltage generator;
the control logic circuit is configured to receive a first read request instruction and control the voltage generator to apply the at least one first read voltage to a word line corresponding to a first word line address in a first read request instruction; and
the control logic circuit is further configured to:
  detect the obtained second read request instruction; and
  when the second word line address included in the second read request instruction is the same as the first word line address, control the voltage generator to apply the at least one second read voltage to the word line corresponding to the first word line address after the end of the application of the at least one first read voltage.

* * * * *